(12) United States Patent
Swoboda et al.

(10) Patent No.: US 11,822,307 B2
(45) Date of Patent: Nov. 21, 2023

(54) LASER CONDITIONING OF SOLID BODIES USING PRIOR KNOWLEDGE FROM PREVIOUS MACHINING STEPS

(71) Applicant: Siltectra GmbH, Dresden (DE)

(72) Inventors: Marko Swoboda, Dresden (DE); Ralf Rieske, Dresden (DE); Jan Richter, Dresden (DE); Franz Schilling, Radeberg (DE)

(73) Assignee: Siltectra GmbH, Dresden (DE)

( * ) Notice: Subject to any disclaimer, the term of this patent is extended or adjusted under 35 U.S.C. 154(b) by 733 days.

(21) Appl. No.: 16/317,464

(22) PCT Filed: Jul. 13, 2017

(86) PCT No.: PCT/EP2017/067737
§ 371 (c)(1),
(2) Date: Jan. 11, 2019

(87) PCT Pub. No.: WO2018/011359
PCT Pub. Date: Jan. 18, 2018

(65) Prior Publication Data
US 2019/0302725 A1 Oct. 3, 2019

(30) Foreign Application Priority Data

Jul. 13, 2016 (DE) .......................... 102016008509.6

(51) Int. Cl.
*H01L 21/66* (2006.01)
*H01L 21/78* (2006.01)
(Continued)

(52) U.S. Cl.
CPC ............ *G05B 19/182* (2013.01); *B23K 26/03* (2013.01); *B23K 26/032* (2013.01);
(Continued)

(58) Field of Classification Search
CPC ........ G05B 19/182; G05B 2219/45165; B23K 26/03; B23K 26/53; B23K 26/032;
(Continued)

(56) References Cited

U.S. PATENT DOCUMENTS 6,323,951 B1 * 11/2001 Borden .............. G01N 21/1717
356/502
6,812,047 B1 * 11/2004 Borden ............ G01N 21/95607
257/E21.53
(Continued)

FOREIGN PATENT DOCUMENTS

| DE | 102014018720 A1 | 6/2016 |
|----|-----------------|--------|
| DE | 102014018841 A1 | 6/2016 |
| WO | 2016083609 A2   | 6/2016 |

*Primary Examiner* — Kenneth M Lo
*Assistant Examiner* — Tameem D Siddiquee
(74) *Attorney, Agent, or Firm* — Murphy, Bilak & Homiller, PLLC

(57) ABSTRACT

The present invention relates to a method for generating control data for the secondary machining of a solid body (1), in particular wafer, which is modified by means of laser beams (10). The interior of said solid body (1) has multiple modifications (12), said modifications (12) having been produced by means of laser beams (10). The method comprises the following steps: defining a criterion of analysis for analyzing the modifications (12) produced in the interior of the solid body (1); defining a threshold value with respect to the criterion of analysis, an analytical value on one side of the threshold value triggering a secondary machining registration; analyzing the wafer by means of an analytical unit (4), said analytical unit (4) analyzing the modifications (12) with respect to the criterion of analysis and outputting analytical values regarding the analyzed modifications, said analytical values lying above or below the threshold value; outputting location data with respect to the analyzed modifications, said location data containing information regard- (Continued)

ing in which region(s) of the solid body (1) the analytical value lie above or below the threshold value; and generating control data for controlling a laser treatment device (11) for the secondary machining of the solid body (1), said control data comprising at least the location data of the modifications (12) registered for secondary machining.

14 Claims, 8 Drawing Sheets

(51) Int. Cl.
| | |
|---|---|
| *H01L 21/67* | (2006.01) |
| *H01L 21/268* | (2006.01) |
| *B23K 26/03* | (2006.01) |
| *B23K 26/04* | (2014.01) |
| *B23K 26/53* | (2014.01) |
| *G05B 19/18* | (2006.01) |
| *B23K 103/00* | (2006.01) |
| *B23K 101/40* | (2006.01) |

(52) U.S. Cl.
CPC .......... *B23K 26/043* (2013.01); *B23K 26/53* (2015.10); *H01L 21/268* (2013.01); *H01L 21/67253* (2013.01); *H01L 21/7806* (2013.01); *H01L 22/12* (2013.01); *H01L 22/20* (2013.01); *B23K 2101/40* (2018.08); *B23K 2103/56* (2018.08); *G05B 2219/45165* (2013.01)

(58) Field of Classification Search
CPC .............. B23K 26/043; B23K 2103/56; B23K 2101/40; H01L 22/12; H01L 21/268; H01L 21/67253; H01L 21/7806; H01L 22/20

See application file for complete search history.

(56) References Cited

U.S. PATENT DOCUMENTS

| | | | |
|---|---|---|---|
| 2005/0012923 A1* | 1/2005 | Shiba ................... | G01R 31/311 356/237.5 |
| 2005/0129303 A1* | 6/2005 | Smilansky ............. | G01N 21/94 382/149 |
| 2011/0013835 A1* | 1/2011 | Eguchi ................. | G01B 11/285 382/168 |
| 2011/0115058 A1* | 5/2011 | Mieczkowski ....... | H01L 23/562 257/620 |
| 2015/0170918 A1* | 6/2015 | Wakabayashi ........ | H01L 21/268 438/530 |
| 2016/0052090 A1* | 2/2016 | Tanigawa ............... | H01L 21/78 219/121.69 |

* cited by examiner

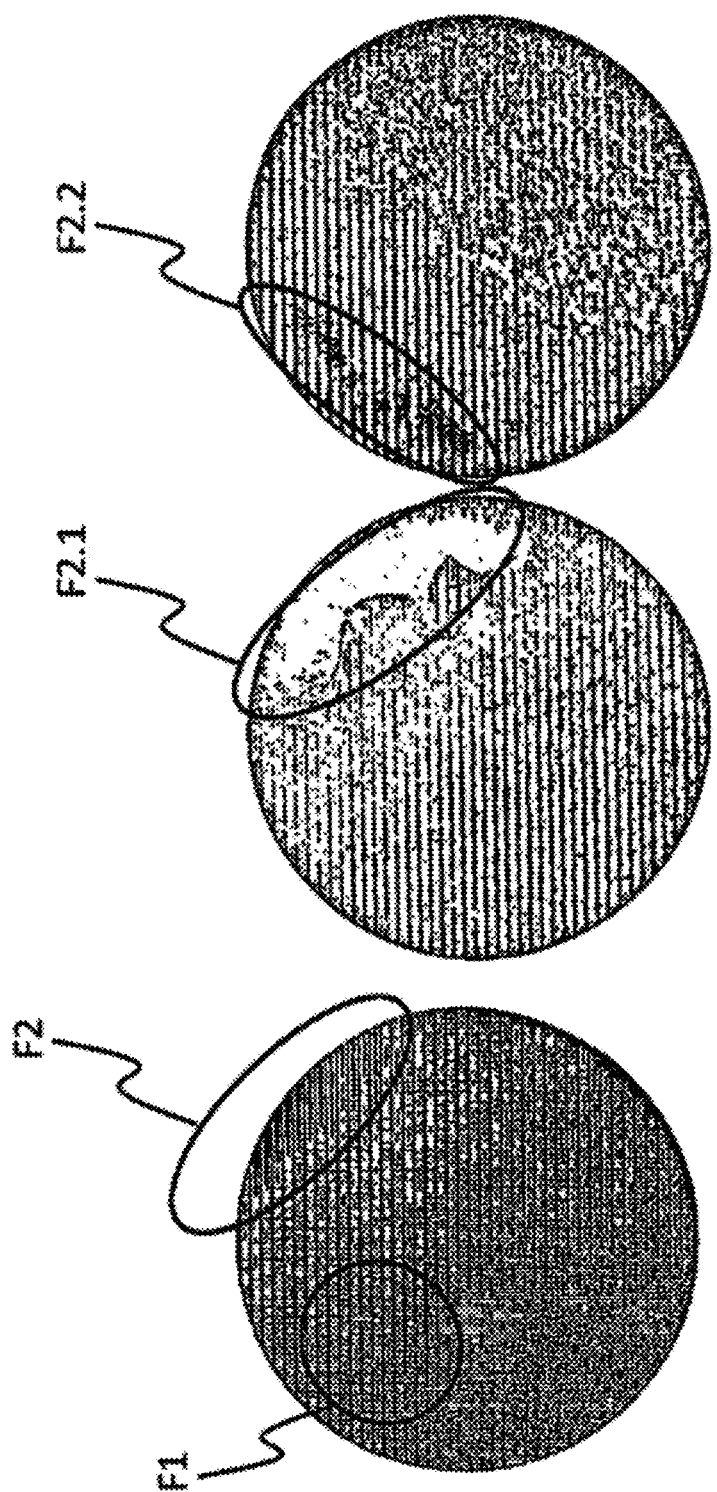

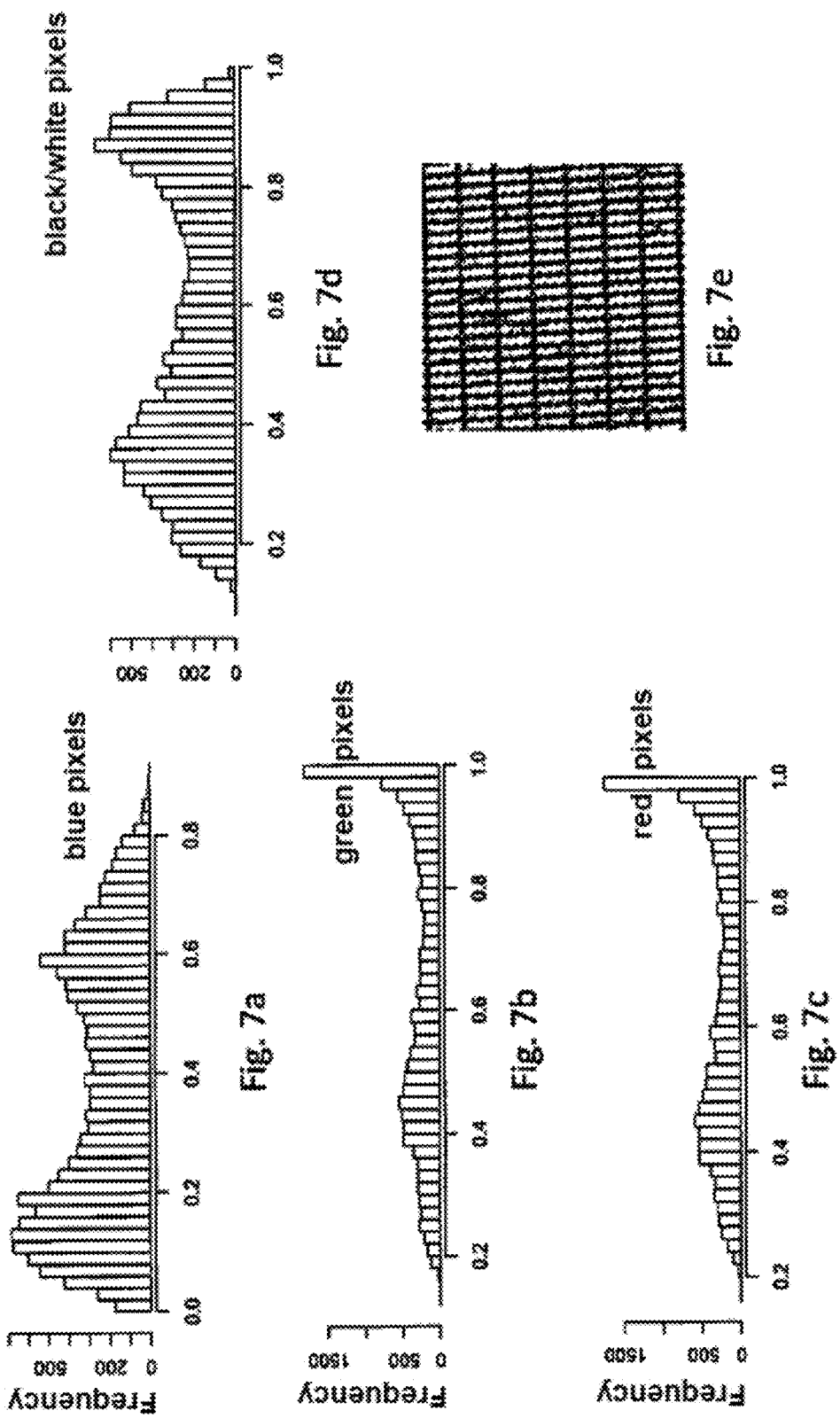

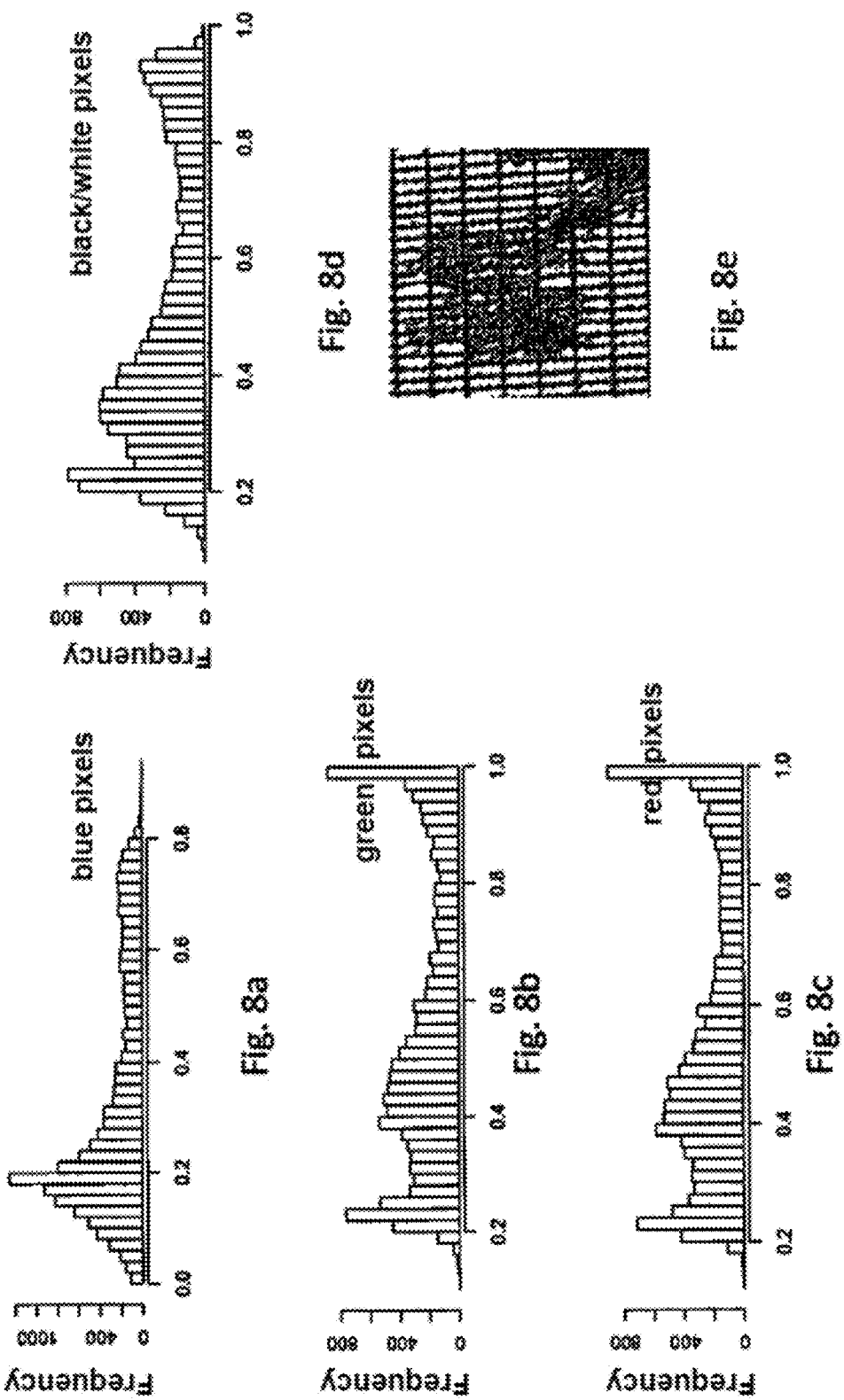

LASER CONDITIONING OF SOLID BODIES USING PRIOR KNOWLEDGE FROM PREVIOUS MACHINING STEPS

The present invention relates, according to claim 1, to a method for generating control data for the secondary machining of a solid body modified by means of laser beams; according to claim 9, to a method for producing modifications in a solid body; according to claim 13, to a method for separating a solid disc from a solid body, and according to claim 14 to a computer program product.

In the prior art, methods are described which disclose the production of modifications in a solid body in order to break up the solid body. However, the solid portions separated by these methods often have a large variation in thickness due to the different materials used and the respective individual defects of the individual solid bodies. But such a variation in thickness is disadvantageous, since complex secondary machining must be performed after the separation of the solid body portions.

It is therefore the object of the present invention to provide a method for generating control data for the secondary machining of a solid body modified by means of laser beams, a method for producing modifications in a solid body, and a method for separating a solid disc from a solid body, wherein solid layers are to be produced whose variation in thickness is less than in the methods that are known from the prior art.

The abovementioned object is achieved according to claim 1 by a method for generating control data for the secondary machining of a solid body, particularly wafer, modified by means of laser beams, wherein the solid has a plurality of modifications in its interior, and wherein the modifications were preferably produced by means of the laser beams. This method preferably comprises at least the steps: Defining an analysis criterion for analyzing the modifications produced inside the solid body; defining a threshold value for the criterion of analysis, an analytical value of the threshold value triggering a secondary machining registration; analyzing the wafer using an analytical unit, the analytical unit analyzing the modifications on the basis of the criterion of analysis and outputting analytical values for the analyzed modifications, with the analytical values being above or below the threshold value; outputting location data on the analyzed modifications, the location data containing the information about the region(s) of the solid body in which the analytical value is above or below the threshold value; generating the control data for controlling a laser treatment device for the secondary machining of the solid body, the control data comprising at least the location data of the modifications or solid body portions that have been registered for secondary machining. This solution is advantageous because, in contrast to previously described material inhomogeneities, the present invention provides for optical characterization during (i.e., simultaneous with) the machining or subsequent to this machining. Machining can be understood in the following as referring to the initial production of modifications and/or the production of modifications in the context of secondary machining. Inhomogeneities in the machining of the material are thus subsequently characterized according to the invention in order to develop a follow-up strategy for further machining. It is therefore an iterative machining method. The first modifications are preferably produced using a first set of parameters, this first set of parameters being used, for example, in the production of modifications in a similar solid body and subsequent further development of the machining. The selection of the parameters of the following iterations can be preferably performed using an algorithm or a series of algorithms and/or specified manually. A plurality of such iterations, including with different radiation or crack-triggering sources, such as ultrasound, heat, cold shock, or mechanically, for example, are especially preferably conceivable according to the invention. The characterization is preferably carried out through the detection and evaluation of the occurring reflection and/or transmission of light, particularly IR radiation and/or visible light. Especially preferably, the light or radiation emitted by the analytical unit, particularly by the source unit, therefore has a wavelength in the range between 400 nm and 900 nm. Additionally or alternatively, however, other characterizations with high spatial resolution are also conceivable, particularly polarization-dependent imaging, ultrasound, X-ray, etc. The source unit can comprise at least or exactly one halogen lamp and/or one or more LEDs, particularly flashable LEDs.

Additional preferred embodiments of the present invention constitute the subject matter of the subclaims and/or the following parts of the description.

According to another preferred embodiment of the present invention, the analytical unit has a source unit and a detector device or detection device, with the source unit emitting waves, particularly light waves, and the detector device detecting the waves transmitted through the solid body and/or the waves reflected by the solid body. Preferably, a processor unit performs an evaluation of the detected parameters, particularly of the luster, immediately after the detection or already during the detection.

According to another preferred embodiment of the present invention, the source unit emits white light and the detection device is preferably designed to detect light of different colors, the detection device comprising a means for detecting blue light and/or a means for detecting red light and/or means for detecting green light. Additionally or alternatively, the detection device can be designed to detect brightness. This embodiment is advantageous, since different light components are reflected, absorbed, and transmitted differently depending on the solid material. The assessment of the detected light components is preferably performed on the basis of predetermined parameters.

According to another preferred embodiment of the present invention, the threshold value specifies how many light components of the light emitted by a defined light source must be reflected in a defined solid portion of the solid body in order for no need for secondary machining to be identified for this defined solid body portion. In addition, the threshold value also preferably indicates the resulting distribution of black or white pixels of a black-and-white histogram composed of a histogram for blue pixels and/or a histogram for green pixels and/or a histogram for a defined region of the solid body. The surface regions can be uniform or have different shapes. Furthermore, the threshold values can be defined or predetermined differently for different regions or for different surface regions. Thus, for example, a threshold value for surface regions in the edge region of the solid body or on the edge region of the solid body can be different from surface regions in the center region of the solid body.

According to another preferred embodiment at least with respect to the preferred optical analysis of parameters, the solid body is subdivided into a plurality of preferably uniform regions, and an analysis is preferably performed on the basis of the criterion of analysis for each of the regions, with control data for the secondary machining of each region being generated on the basis of which the assessment of the analytical values identifies a need for secondary machining.

This embodiment is advantageous, since the secondary machining of a region is triggered not when only isolated, marginal defects are detected, but rather only when a minimum relevance (the threshold value) has been reached or exceeded. This enables the solid body to be machined more quickly while simultaneously ensuring the subsequent crack progression.

According to another preferred embodiment of the present invention, the preferably uniform regions form a rectangular basic shape. In addition, control data for the complete secondary machining of this region are preferably generated for each region for which a need for secondary machining has been identified. The control data are then part of a set of parameters or constitute the set of parameters that can be used to control secondary machining.

In addition, a superordinate threshold value criterion is also especially preferably applied, in which case, according to the superordinate threshold value criterion, the regions for which a need for secondary machining has been identified are not reworked if the total surface area of these regions is less than a predetermined value, particularly less than 20% or less than 10% or less than 5% or less than 1% of the total surface area of all regions, and/or if one or more regions are located at a predetermined distance from the outer edge of the solid body or from a center of the solid body.

The solid body is thus preferably put iteratively through machining and analysis steps either subsequently or in situ into a configuration that permits or enables very even, homogeneous crack conduction.

The abovementioned object is also achieved according to the invention by a method for producing modifications in a solid body. This method preferably comprises at least the steps: Producing modifications in a solid body by means of laser beams of a laser device, carrying out a previously mentioned method for generating control data for the secondary machining of a solid body modified by means of laser beams, and renewed application of laser beams of the laser device to the regions identified by the control data. This solution is advantageous, since the modifications produced in the context of the secondary machining are produced in predetermined locations and thus at least indirectly on the basis of information about a subsequent crack form (without secondary machining). Through the use of the information about the predicted crack progression, secondary machining can already be carried out before crack conduction at the points at which the crack progression predicts a form that lies outside of a tolerance range in order to bring the crack progression to within the tolerance range bring at these points as well.

According to another preferred embodiment of the present invention, the method for generating control data for the secondary machining of the solid body modified by means of laser beams is carried out at least intermittently during the production of the modifications. This is advantageous, since the solid body is put into the desired configuration in one work step, which speeds up the process.

According to another preferred embodiment of the present invention, after the detection of at least one region to be subjected to secondary machining, a check is performed on the basis of another criterion, particularly a distance and/or time criterion, using algorithms as a function of the modifications produced and/or of the modifications yet to be produced, with additional modifications being produced or the secondary machining being carried out on the basis of the additional criterion. This embodiment is advantageous because, for example, the path that the laser device and/or the laser beams has traveled relative to the solid body (or vice versa) during the secondary machining is optimized, which accelerates the process.

According to another preferred embodiment of the present invention, the analytical unit analyzes at least one parameter that can be determined on the surface of the solid body, with the parameter being dependent on modifications produced inside the solid body, and with the parameter being preferably the luster of the solid body. This embodiment is advantageous because it is preferably possible to generate a prognosis for the subsequent course of the crack by purely optical means, thus enabling corresponding reworking to be carried out in order to improve the crack conduction even before crack conduction.

According to another preferred embodiment of the present invention, the modifications are local cracks in the crystal lattice and/or material fractions conveyed to at least one other phase, and/or the modifications are produced by means of laser beams of a radiation source that is embodied as a laser device introduced via an outer surface of the donor substrate or solid body, particularly on which the carrier substrate is arranged.

The abovementioned object is also achieved by a method for separating a solid disc or solid layer or solid stratum or wafer from a solid body. According to the invention, this method comprises at least the steps: Carrying out a method as set forth in claims 9 to 13; arranging or producing a voltage-generating layer on the carrier substrate; thermally energizing the voltage generating layer to create voltages in the donor substrate, the voltage generation initiating a crack that propagates along the predetermined crack path for separating the solid layer from the donor substrate such that the solid layer separates with the carrier substrate bonded on it.

This solution is advantageous because very flat solid discs can be produced through the advantageously produced modifications in conjunction with the crack initiation produced by the voltage-generating layer.

The abovementioned object is also achieved according to the invention by a computer program product for carrying out a method as set forth in claims 1 to 9.

The voltage-generating layer preferably comprises or consists of a polymer, particularly polydimethylsiloxane (PDMS), with the thermal loading preferably occurring such that the polymer undergoes a glass transition, and with the voltage-generating layer being brought to a temperature below room temperature or below 0° C. or below −50° C. or below −100° C. or below −110° C., particularly to a temperature below the glass transition temperature of the voltage-generating layer, particularly using liquid nitrogen.

The solid body preferably comprises a material or a combination of materials from one of main groups 3, 4 and 5 of the periodic table of the elements, such as Si, SiC, SiGe, Ge, GaAs, InP, GaN, $Al_2O_3$ (sapphire), AlN. Especially preferably, the solid body has a combination of elements occurring in the third and fifth group of the periodic table. Conceivable materials or combinations of materials include gallium arsenide, silicon, silicon carbide, etc. The solid body can further comprise a ceramic (e.g., $Al_2O_3$— alumina) or consist of a ceramic, with preferred ceramics being Perovskite ceramics (such as Pb-, O-, Ti/Zr-containing ceramics) in general and lead-magnesium niobates, barium titanate, lithium titanate, yttrium aluminum garnet, particularly yttrium aluminum garnet crystals for solid-state laser applications, SAW (surface acoustic wave) ceramics such as lithium niobate, gallium orthophosphate, quartz, calcium titanate, etc., in particular. Therefore, the solid body preferably comprises a semiconductor material or a ceramic material or, especially preferably, the solid body consists of at least one semiconductor material or one ceramic material. Moreover, it is conceivable for the solid body to comprise or consist or be partially made of a transparent material, such as corundum, for example, particularly in the alpha phase or gamma phase. Examples of additional materials that merit consideration as a solid body alone or in combination with another material include "wide band gap" materials, lnAISb, high-temperature superconductors, particularly rare earth cuprates (e.g., $YBa_2Cu_3O_7$). It is additionally or alternatively conceivable for the solid body to have a photomask, in which case any photomask material and, especially preferably, combinations thereof known on the date of filing can be preferably used as photomask material in the present case.

The use of the word "substantially" preferably defines a deviation from the meaning that would be conveyed without the use of this word in the range of from 1% to 30%, particularly from 1% to 20%, more particularly from 1% to 10, yet more particularly from 1% to 5%, and even more particularly from 1% to 2%, in all cases in which this word is used in the context of the present invention. Individual or all illustrations of the figures described below are to be preferably regarded as construction drawings, meaning that the dimensions, proportions, functional relationships, and/or arrangements following from the figure or figures preferably correspond exactly or preferably substantially to those of the device according to the invention or of the product according to the invention. Further advantages, aims, and features of the present invention will now be explained on the basis of the following description of appended drawings, which exemplarily illustrate devices according to the invention. Elements of the devices and methods according to the invention whose function is at least substantially congruent may be denoted by the same reference symbols, with the components not being necessarily denoted or explained in all figures. The invention will now be described purely by way of example with reference to the accompanying drawing.

In the drawing:

FIG. 4a shows an additional analytical graphic of a solid body that has been provided with modifications;

FIG. 4b shows the lower half of the solid body shown in FIG. 4a after a division of the solid body along a crack propagation plane that was predetermined by the modifications;

FIG. 4c shows the upper half of the solid body shown in FIG. 4a after a division of the solid body along a crack propagation plane that was predetermined by the modifications;

FIG. 7a-7d shows histograms for an analytical subregion;

FIG. 7e shows the analytical subregion for which the histograms of FIGS. 7a-7d have been generated;

FIGS. 8a-8d shows histograms for an analytical subregion; and

FIG. 8e shows the analytical subregion for which the histograms of FIGS. 8a-8d have been generated.

Figure 1B:
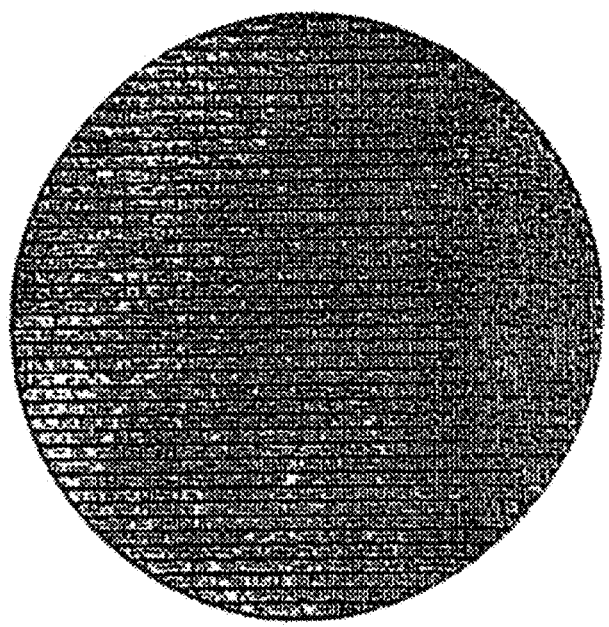
FIG. 1b shows an analytical graphic of an alternative solid body that has been provided with modifications.
Figure 1A:
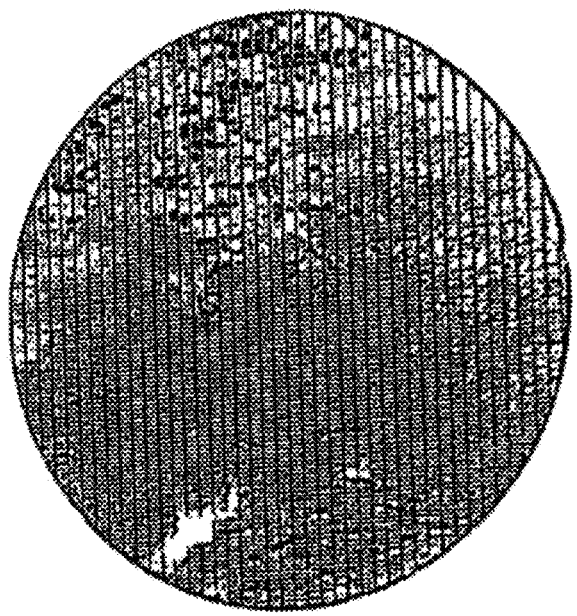
FIG. 1a shows an analytical graphic of a solid body that has been provided with modifications.

FIGS. 1a and 1b respectively show analytical graphics of solid bodies 1 after the production of modifications 12 within the respective solid bodies 1. The modifications 12 within the respective solid body 1 are used to specify a region of detachment or of crack conduction along which a portion, particularly a solid layer, can be detached or separated from the solid body.

The analytical graphic of FIG. 1a shows a much more heterogeneous image than the analytical graphic of FIG. 1b. An analytical graphic such as that shown in FIG. 1a, for example, results from inclusions or other defects of the lattice structure of the solid body 1.

Figures 2A, 2B:
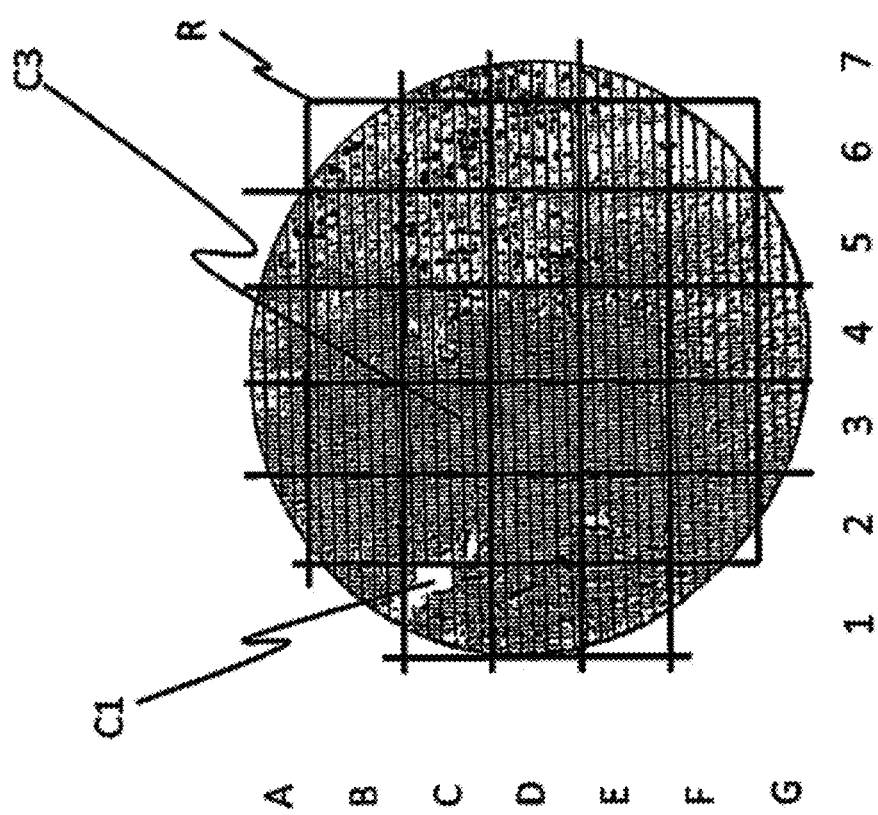
FIG. 2a shows an analytical graphic of the solid body shown in FIG. 1a, with the region of analysis being subdivided into a plurality of subregions of analysis.
FIG. 2b shows marked subregions of analysis in which a need for secondary machining has been identified.

FIG. 2a shows a subdivision of the region of analysis into analytical subregions. Each analytical subregion is preferably analyzed by means of the analytical unit. The analysis of an analytical subregion is preferably performed by applying waves, particularly light waves, to the analytical subregion. The waves that are reflected and/or transmitted and/or absorbed are detected or determined by means of a detection device 6. It can be seen that analytical subregion C3 has a distinctly different appearance and thus different properties, particularly different mechanical and/or chemical properties, than analytical subregion C1, for example.

For example, if the solid body is made of silicon carbide, the modifications are produced in a preferred case by means of a femtosecond laser and thus by means of femtosecond pulses. A numerical aperture of preferably between 0.1 and 1, particularly of 0.65 or substantially 0.65, is preferably used. The solid body is preferably preconditioned by producing modifications 12, particularly through the writing of lines to a depth of 20 to 500 microns, particularly to a depth of 50 microns to 300 microns—to a depth of 180 microns or substantially 180 microns, for example. The modifications 12 are preferably produced in such an arrangement that lines result if the resolution is appropriate. The modifications 12 are thus preferably produced in succession in the same direction and more preferably at the same distance from one another. Furthermore, a plurality of lines of modifications 12 are preferably generated next to one another, particularly parallel to one another. The individual lines are preferably produced at the same distance from one another or at substantially the same distance from one another. Furthermore, additional lines can be produced from modifications 12 that are inclined relative to the other lines, particularly aligned orthogonally thereto. Preferably, the lines extending in a first direction intersect a plurality of lines that preferably extend in a different direction.

A phase transformation of the material of the solid body 1 takes place especially preferably in the interior of the solid body 1. In the case of silicon carbide, the phase transformation brings about the presence of material in a carbon and in a silicon phase. According to the invention, this results in microcracks in the interior of the solid 1, the microcracks preferably representing a transmission optical density of the material of the solid body 1. The phases produced create stress zones in the material. This results from the expansion of the new phases in the interior of the solid body 1. For instance, the carbon and silicon phases are larger in volume than the corresponding SiC crystal lattice portion before the transformation. This causes the generation of compressive stress inside the solid body 1, resulting in cracks along the crystal planes of silicon carbide. The triggered cracks can be seen in an analytical graphic as a characteristic luster of the material.

One criterion of analysis can thus be the luster of the solid body 1, for example, since this is the result of the modifications 12 produced in the solid body 1, particularly the cracks caused by the modifications 12, under a corresponding or predefined illumination. Reference symbol C3 thus denotes an analytical subregion with homogeneous crack propagation and therefore with a high degree of luster. On the other hand, reference symbol C1 denotes an analytical subregion with less luster and thus with cracks in the crystal that are not completely planar.

The fields (C1, C3) of a grid R are preferably smaller than 100 $cm^2$, or smaller than 50 $cm^2$, or smaller than 10 $cm^2$, or smaller than 5 $cm^2$, or smaller than 1 $cm^2$, or smaller than 0.5 $cm^2$, or smaller than 0.1 $cm^2$.

FIG. 2b shows a representation that has been modified relative to that of FIG. 2a. Regions are designated here for which a need for secondary machining has been identified by means of the method according to the invention for generating control data 3 for the secondary machining of a solid body 1, particularly wafer, modified by means of laser beams. The designated regions are marked by black fields. According to the method according to the invention, it is preferred to first define a criterion for analyzing the modifications 12 produced in the interior of the solid body 1. Furthermore, a threshold value is defined for the criterion of analysis, with an analytical value on one side of the threshold value triggering the secondary machining registration. The solid body 1 is then analyzed using an analytical unit 4, the analytical unit 4 analyzing the modifications 12 on the basis of the criterion of analysis. The analytical values are then outputted in another step, with the analytical values being at least predominantly above or below the threshold value. Location data are also outputted, with the location data containing the information about in which region(s) of the solid body 1 the analytical value is above or below the threshold value. Moreover, control data 3.1 for controlling a laser treatment device 20 for the secondary machining of the solid body 1 are generated and include least the location data of the modifications 12 and solid body portions that have been registered for secondary machining. The laser treatment device can correspond to or be the laser device 11. The modifications 12 or modification regions registered for reworking are shown schematically as black rectangles in the case shown in FIG. 2b. It is conceivable here for the modification regions or analytical subregions to be rectangular, triangular, polygonal, or partially or completely curved, in particular elliptical or round.

Figure 3:
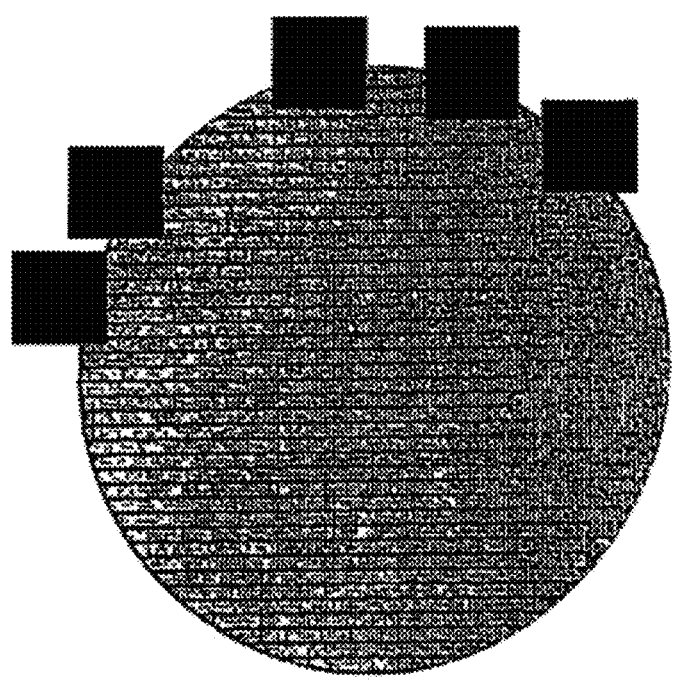
FIG. 3 shows the analytical graphic of the solid body shown in FIG. 1b, with subregions of analysis being designated for which a need for secondary machining has been identified.

FIG. 3 shows the analytical graphic of the solid body shown in FIG. 1b, with subregions of analysis being designated for which a need for secondary machining has been identified.

It can be seen here that the grid shown with reference to FIG. 2b does not always have to have the same shape. Moreover, it is preferred that only those portions be registered for secondary machining that are part of the solid body. The portions of the analytical subregions that lie outside of the solid body 1 are especially preferably neither analyzed nor exposed to laser beams during secondary machining.

The fields of a grid are preferably smaller than 100 $cm^2$, or smaller than 50 $cm^2$, or smaller than 10 $cm^2$, or smaller than 5 $cm^2$, or smaller than 1 $cm^2$, or smaller than 0.5 $cm^2$, or smaller than 0.1 $cm^2$.

The remaining portions (which are not covered by black rectangles) are very homogeneous, meaning that secondary machining is not necessary here. Furthermore, it is conceivable for no secondary machining to be carried out even in the regions for which a need for secondary machining has been identified because the total need for secondary machining is lesser or greater than a predetermined superordinate threshold value criterion. According to the superordinate threshold value criterion, the regions for which a need for secondary machining has been identified are not reworked if the total surface area of these regions is less than a predetermined value, particularly less than 20% or less than 15% or less than 10% or less than 5% or less than 1% of the total surface area of all regions, and/or if one or more regions are located at a predetermined distance from the outer edge of the solid body 1 or from a center of the solid body 1.

According to the invention, solid body portions for which no need for secondary machining has been identified can be partially or completely registered for secondary processing if one or more of such solid body portions are between solid body portions for which a need for secondary machining has been identified.

FIG. 4a shows an analytical graphic, particularly a luster image, of a solid body 1 that has been provided with modifications. The field F1 denotes a region with very homogeneous crack propagation, and the field F2 denotes a region with very heterogeneous crack propagation.

FIG. 4b shows the surface of a first (in particular lower) separated solid body portion, particularly of an ingot, after the splitting-off a solid layer 1 (see FIG. 4c). It can be seen that the field F2 visible in FIG. 4a also brings about a field F2.1 that is very heterogeneous relative to the remaining portions in the surface later exposed by the split. Furthermore, the other exposed surface shown in FIG. 4c has a field F2.2 that corresponds, in particular negatively, to field F2.1 (see FIG. 4b).

It was thus recognized in the present case that cracks and their special optical signal are good indicators of the success of a laser processing on the plane and the resulting subsequent cleaving-off of a solid layer 4 from the solid body 1 or division of the solid body.

Regions without triggered cracks (e.g., detected by luster=optical signal) thus show defects even before the detachment or separation of the solid layer 4. During the separation of a solid layer 4, these defects result in undesirable unevenness or variations in thickness that are more pronounced than in the other regions and lead to treatment processes or rejects. The greater the material removal in the treatment processes (e.g., loops), the thicker the solid disc 4 must be in order to compensate for the potential material removal. It is clear that this leads to high material consumption and also requires very flexible downstream processes. The elimination of such problems by exploiting the information about the crack distribution in the interior of the solid body 1, which can be obtained after the modification 12 using waves, thus enables advantageous secondary machining even before a solid layer 4 has been split off.

Figure 5B:
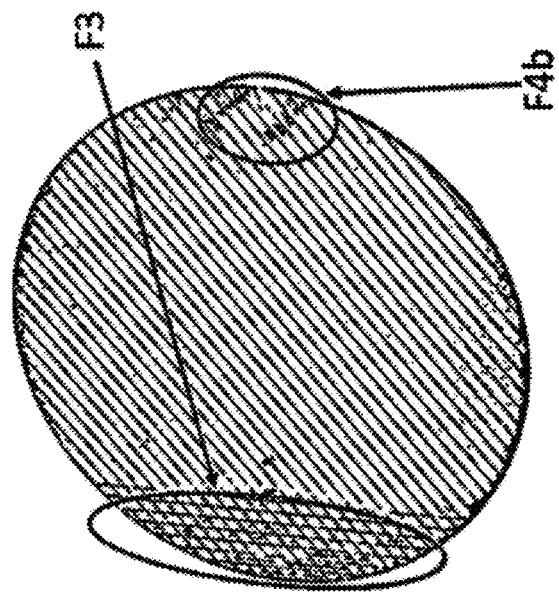
FIG. 5b shows another schematic analytical graphic of the solid body shown in FIG. 5a after secondary machining.
Figure 5A:
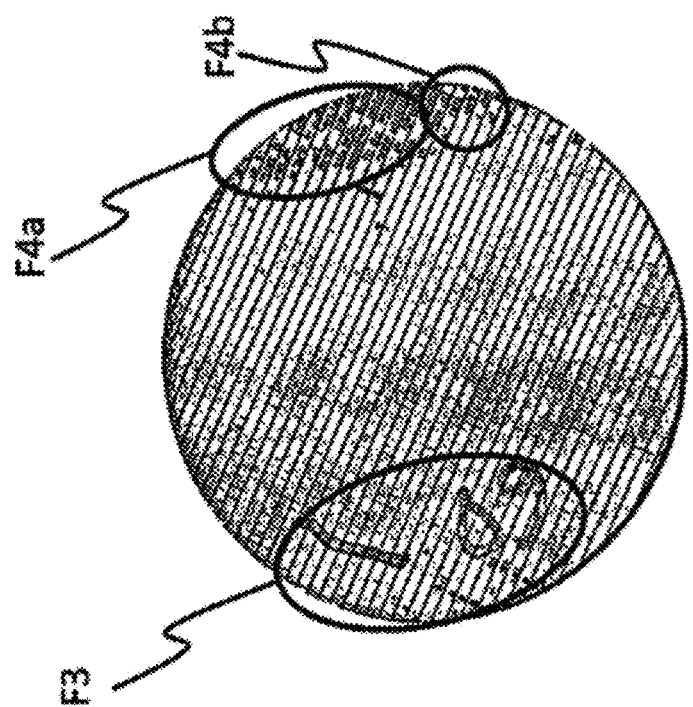
FIG. 5a shows a schematic analytical graphic, particularly a luster image, of a solid body after the production of the modifications.

FIG. 5a shows an analytical graphic of a solid body 1 after the production of the modifications 12 in the interior of the solid body 1. Fields F3 and F4a have been reworked. This resulted in the clearly more homogeneous analytical graphic shown in FIG. 5b. Only the non-reworked region F4b has more pronounced inhomogeneity. In the reworked portions, the secondary machining brought about crack propagation in the interior of the solid body 1, particularly by single or multiple modifications 12 through or along single or multiple modifications 12. Defects therefore still exist in the non-reworked portion F4b.

The secondary machining thus improves a parameter that can be preferably detected by optical means and especially preferably on the basis of the size and/or number of the modifications 12 produced, with this parameter preferably being the luster of the solid body 1 as measured under defined illumination. Secondary machining thus improves crack initiation in regions with a reduced optical signal. The detection of the regions to be subjected to secondary machining is therefore preferably performed after the initial machining or during the initial machining, particularly using an optical signal such as the luster, for example.

In situ detection of the parameter to be analyzed, particularly of the optical signal, is preferably performed. The optical signal of the machining success preferably represents the crack luster of the solid body 1 with spatial resolution. This parameter, particularly the optical signal of the crack luster, can be recorded during machining. A map of the material can be prepared from the recorded data and used for secondary machining.

Alternatively, using a detection device solution, particularly a camera, the sample can be imaged for the parameter, particularly in reflection, and the signal can then also be preferably evaluated during machining, particularly during the production of the modifications 12 and/or during the secondary machining, for a preferably integral secondary machining step.

Figure 6:
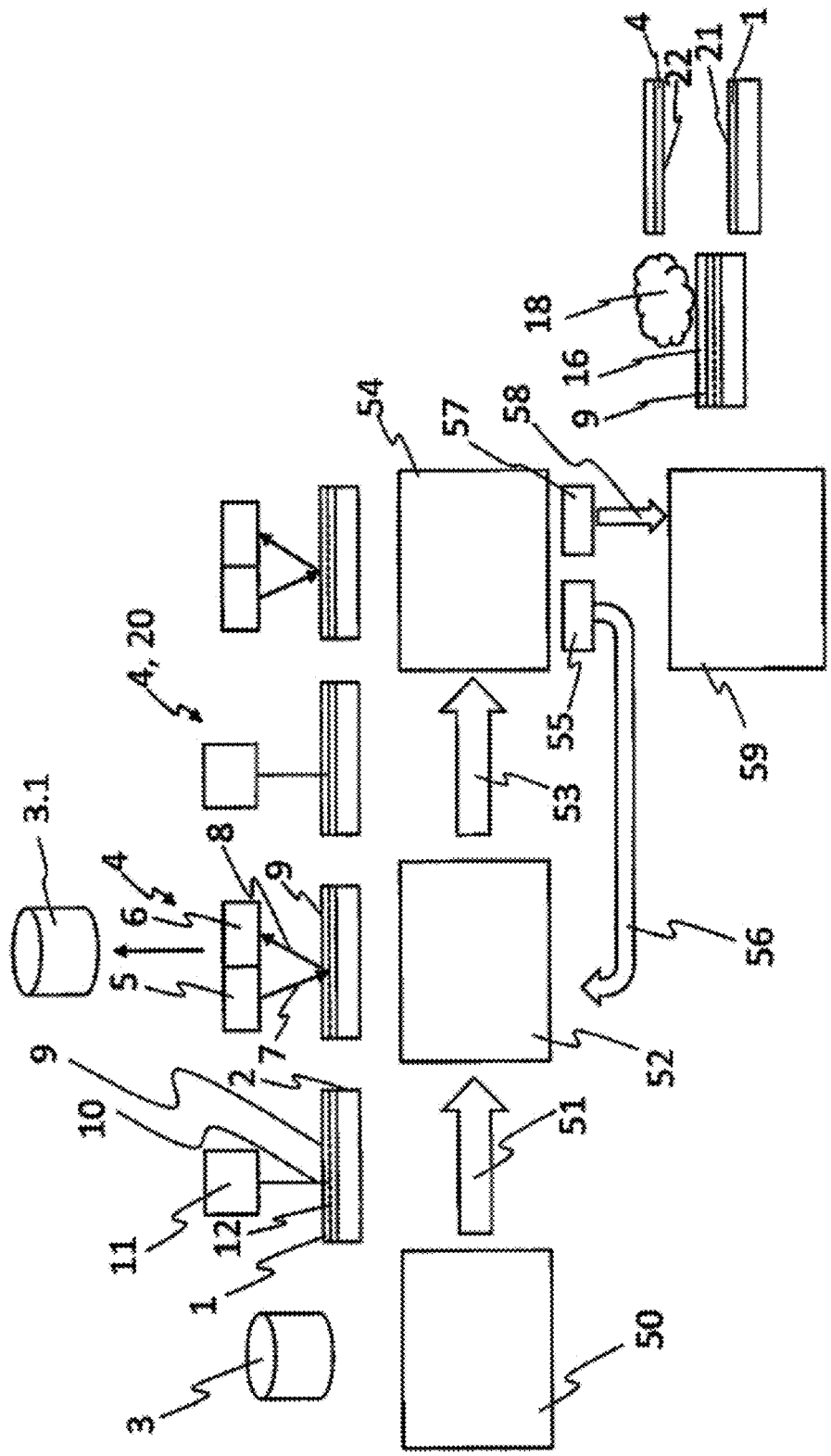
FIG. 6 shows a schematic flowchart of the method according to the invention for separating a solid disc from a solid body.

FIG. 6 shows a schematic method and a schematic representation of examples of the operations taking place specifically in the respective method steps.

Reference numeral 50 preferably denotes the entry of the material, particularly of the solid body 1, and the registration of the parameters or the specific set of parameters intended for the initial machining of the material. The set of parameters preferably comprises data for controlling an analytical unit 4, particularly a source and/or detection device, such as the wave characteristics of the waves to be radiated and/or threshold values for handling the data detected by the detection device 6. Reference numeral 3 denotes a symbol that represents the registration of the set of parameters provided for the machining of the material in the context of the present invention. The machining of the material or of the solid body 1 is indicated in the schematic method by the arrow marked with the reference numeral 51. In this step, laser treatment of a solid body 1 fixed in a receiving device 2, particularly a chuck, with laser radiation 10 of a laser device 11 is preferably performed. The laser beams 10 penetrate into the solid body 1 via a surface 9 of the solid body 1, on which a voltage-generating layer 16 is arranged. The laser beams 10 preferably produce a plurality of modifications 12 in the interior of the solid body 1. The modifications 12 are preferably changes in the crystal lattice of the solid body 1. The modifications 12 can be preferably material fractions of the solid body 1 that have been transformed to another phase or cracks in the solid body 1 or destroyed material fractions in the interior of the solid body 1.

Reference numeral 52 denotes another method step, namely the subsequent or in situ detection or analysis for determining a modified or other set of parameters. The analytical unit 4 preferably has a source unit 5, particularly an IR light source or a light source that preferably emits visible light, for the emission of light 7 and a detection device 6 for detecting the reflected components 9 of the light. A minimum proportion of the light 7 or the radiation penetrates into the solid body 1 and is then at least partially reflected by the modifications 12 produced. The modifications 12 preferably form cracks in the crystal lattice of the solid body 1, and the light 7 or the radiation is reflected at the grain edges formed by the cracks, particularly microcracks.

A new or modified set of parameters 3.1 is then preferably generated that is preferably used to control a secondary machining device 20. However, it is conceivable here for the secondary machining device 20 and the laser device 11 to be identical or the same device.

A secondary machining of the solid body 1 is then carried out according to method step 53 using the secondary machining device 20 on the basis of the new or modified set of parameters 3.1.

Analogously to reference numeral 52, reference numeral 54 denotes further subsequent or in situ detection or analysis. A check is preferably performed here whether the secondary machining was successful. If the result the detection or analysis does not meet the specifications (decision field 55), then a new or modified set of parameters is generated again for further secondary machining of the solid body 1. If the detection or analysis result meets the specifications (decision box 57), then the solid body 1 is fed to further process steps 59, particularly to a cold split process. Preferably, a voltage-generating layer 16, particularly a polymer layer, is applied to the solid body 1. A fluid 18, particularly a gas or a liquid, having a temperature below the glass transition temperature of the material of the voltage-generating layer 16, particularly a fluid 18 having a temperature of less than 15° C. or less than 0° C. or less than −10° C. or less than −50° C. or less than −100° C., is then preferably applied to this voltage-generating layer 16. This leads to the generation of mechanical stresses in the interior of the solid body 1, thereby propagating a crack along a region of detachment that is defined by the modifications 12. This results in a separated solid layer 4 with a new surface 22 and a reduced solid body 1 with a new surface 21.

Besides silicon carbide, this method can also be preferably used for silicon, gallium nitride, aluminum nitride, gallium arsenide, and other materials.

FIG. 7e shows a photograph of an analytical subregion. FIGS. 7a to 7c show histograms for the analytical subregion shown in FIG. 7e. FIG. 7d shows a histogram for black/white pixels for the analytical region shown in FIG. 7e. The histogram for black/white is preferably composed of the histograms for blue, red, and green pixels. For example, if a threshold value such as 0.6 were set in the black/white histogram, then the black levels would be 55.35% and the white levels would be 44.65% in the special example shown.

FIG. 8e shows a photograph of an analytical subregion. FIGS. 8a to 8c show histograms for the analytical subregion shown in FIG. 8e. FIG. 8d shows a histogram for black/white pixels for the analytical region shown in FIG. 8e. The histogram for black/white is preferably composed of the histograms for blue, red, and green pixels. For example, if a threshold value such as 0.6 were set in the black/white histogram, then the black levels would be 71.1% and the white levels would be 28.9% in the special example shown.

The relationship between the black levels in the image and the homogeneity of the picture shown in the respective seen from the illustrations in FIGS. 7e and 8e.

According to the invention, a method for generating control data for the secondary machining of a solid body 1, particularly wafer, modified by means of laser beams 10 is thus provided in which the solid body 1 has a plurality of modifications 12 in its interior, and in which the modifications 12 were produced by means of the laser beams 10. This method according to the invention preferably comprises at least the steps: Defining an analysis criterion for analyzing the modifications 12 produced inside the solid body 1; defining a threshold value for the criterion of analysis, an analytical value of the threshold value triggering a secondary machining registration; analyzing the wafer using an analytical unit 4, the analytical unit 4 analyzing the modifications 12 to the criterion of analysis and outputting analytical values, with the analytical values being above or below the threshold value; outputting location data, the location data containing the information about the region(s) of the solid body 1 in which the analytical value is above or below the threshold value; generating the control data for controlling a laser treatment device 11 for the secondary machining of the solid body 1, the control data comprising at least the location data of the modifications 12 that have been registered for secondary machining.

LIST OF REFERENCE SYMBOLS

1 solid body
2 donor substrate
3 3 set of parameters
3.1 modified or new set of parameters
4 analytical unit
5 source unit
6 detection device
7 waves
8 reflected components of the waves 7
9 surface of the solid body
10 laser beams
11 laser device
12 modifications
16 voltage-generating layer
18 coolant
20 exposed new surface of the reduced solid body
22 exposed new surface of the separated solid layer 50-59 steps in the preferred method sequence
F1 field F1
F2 field F2
F2.1 surface structure in the vicinity of the field F2 on one side of the split
F2.2 surface structure in the vicinity of the field F2 on the other side of the split

The invention claimed is:

1. A method for generating control data for secondary machining of a solid body, modified by means of laser beams, wherein an interior of the solid body has a plurality of modifications, and wherein the plurality of modifications was produced by means of the laser beams, the method comprising:
    defining a criterion of analysis for analyzing the plurality of modifications produced in the interior of the solid body;
    defining a threshold value for the criterion of analysis, with an analytical value on one side of the threshold value triggering a secondary machining registration;
    analyzing the solid body using an analytical unit, the analytical unit analyzing the plurality of modifications based on the criterion of analysis;
    outputting analytical values for the analyzed modifications, the analytical values being above or below the threshold value;
    outputting location data containing information about in which one or more regions of the solid body the analytical value is above or below the threshold value; and
    generating control data for controlling a laser treatment device for the secondary machining of the solid body and that includes at least the location data on the one or more regions of the solid body that have been registered for secondary machining.

2. The method of claim 1, wherein the analytical unit comprises a source unit configured to emit waves and a detector device configured to detect the waves transmitted through the solid body and/or the waves reflected by the solid body.

3. The method of claim 2, wherein the source unit is configured to emit white light, and wherein the detection device is configured to detect blue light, red light and green light.

4. The method of claim 1, wherein the threshold value specifies how many light components of light emitted by a defined light source must be reflected in a defined solid portion of the solid body so that no secondary machining is identified for the defined solid portion.

5. The method of claim 1, wherein the threshold value indicates a resulting distribution of black or white pixels of a black-and-white histogram composed of a histogram for blue pixels, a histogram for green pixels, and a histogram for red pixels for a defined region of the solid body.

6. The method of claim 1, wherein the solid body is subdivided into a plurality of uniform regions, and wherein the analysis is performed based on the criterion of analysis for each of the uniform regions, with control data for the secondary machining of each uniform region being generated on the basis of which the assessment of the analytical values identify a need for secondary machining.

7. The method of claim 6, wherein the uniform regions of the solid body form a rectangular shape, and wherein for each uniform region for which a secondary machining is registered, control data is generated for complete secondary machining of the uniform region.

8. The method of claim 6, wherein a higher threshold value is additionally applied, in which case, according to a superordinate threshold value criterion, the uniform regions of the solid body for which secondary machining is registered are not reworked if a total surface area of these uniform regions is less than a predetermined value and/or if one or more uniform regions are located at a predetermined distance from an outer edge of the solid body or from a center of the solid body.

9. The method of claim 1, further comprising:
    producing the plurality of modifications in the solid body by means of the laser beams of a laser unit to specify a crack path; and
    after generating the control data for the secondary machining of the solid body, renewing application of laser beams of the laser unit to the one or more regions of the solid body that were registered for secondary machining by the control data.

10. The method of claim 9, wherein the control data for the secondary machining of the solid body is generated at least intermittently during the producing of the plurality of modifications in the solid body.

11. The method of claim 9, wherein after detecting at least one region to be subjected to secondary machining, performing a check based on another criterion using algorithms as a function of the modifications produced and/or of the modifications yet to be produced, with additional modifications being produced or the secondary machining being carried out based on the additional criterion.

12. The method of claim 9, wherein the modifications comprise local cracks in a crystal lattice of the solid body and/or material fractions that have been transformed to another phase of the solid body, and/or wherein the modifications are produced via an outer surface of the solid body on which a voltage-generating layer is arranged.

13. The method of claim 9, further comprising:
arranging or producing a voltage-generating layer on the solid body; and
thermally energizing the voltage-generating layer to generate voltages in the solid body, with a crack being initiated that propagates along the crack path for separating a solid layer from the solid body.

14. A non-transitory computer readable medium storing a computer program operable to generate control data for secondary machining of a solid body, modified by means of laser beams, wherein an interior of the solid body has a plurality of modifications, and wherein the plurality of modifications was produced by means of the laser beams, the computer program comprising:

program instructions to define a criterion of analysis for analyzing the plurality of modifications produced in the interior of the solid body;
program instructions to define a threshold value for the criterion of analysis, with an analytical value on one side of the threshold value triggering a secondary machining registration;
program instructions to analyze the solid body using an analytical unit, the analytical unit analyzing the plurality of modifications based on the criterion of analysis;
program instructions to output analytical values for the analyzed modifications, the analytical values being above or below the threshold value;
program instructions to output location data containing information about in which one or more regions of the solid body the analytical value is above or below the threshold value; and
program instructions to generate control data for controlling a laser treatment device for the secondary machining of the solid body and that includes at least the location data on the one or more regions of the solid body that have been registered for secondary machining.

* * * * *